Jan. 27, 1970 D. L. BEHRENDT 3,492,535

CERAMIC CIRCUIT CARD

Filed Jan. 8, 1968

INVENTOR
DONALD L. BEHRENDT

BY Louis A. Kline
John J. Matlago
HIS ATTORNEYS

United States Patent Office 3,492,535
Patented Jan. 27, 1970

3,492,535
CERAMIC CIRCUIT CARD

Donald L. Behrendt, Long Beach, Calif., assignor to The National Cash Register Company, Dayton, Ohio, a corporation of Maryland Filed Jan. 8, 1968, Ser. No. 696,209
Int. Cl. H02b 1/00, 1/04, 9/00
U.S. Cl. 317—100 7 Claims

ABSTRACT OF THE DISCLOSURE

A circuit card comprised of an alumina ceramic substrate card with a multilayer pattern of conductors on one surface and a conductive plane on the opposing surface. Pads, formed on circuit sites by increasing the lateral dimension of a conductor, are connected by the conductive pattern and a conductive layer about the edge of the substrate card to the plane on the opposing surface. The heat from thermal emitting circuit modules mounted on the pads with a conductive thermal compound therebetween, is circulated away from the modules by the connecting conductive path.

Figures 1, 2:
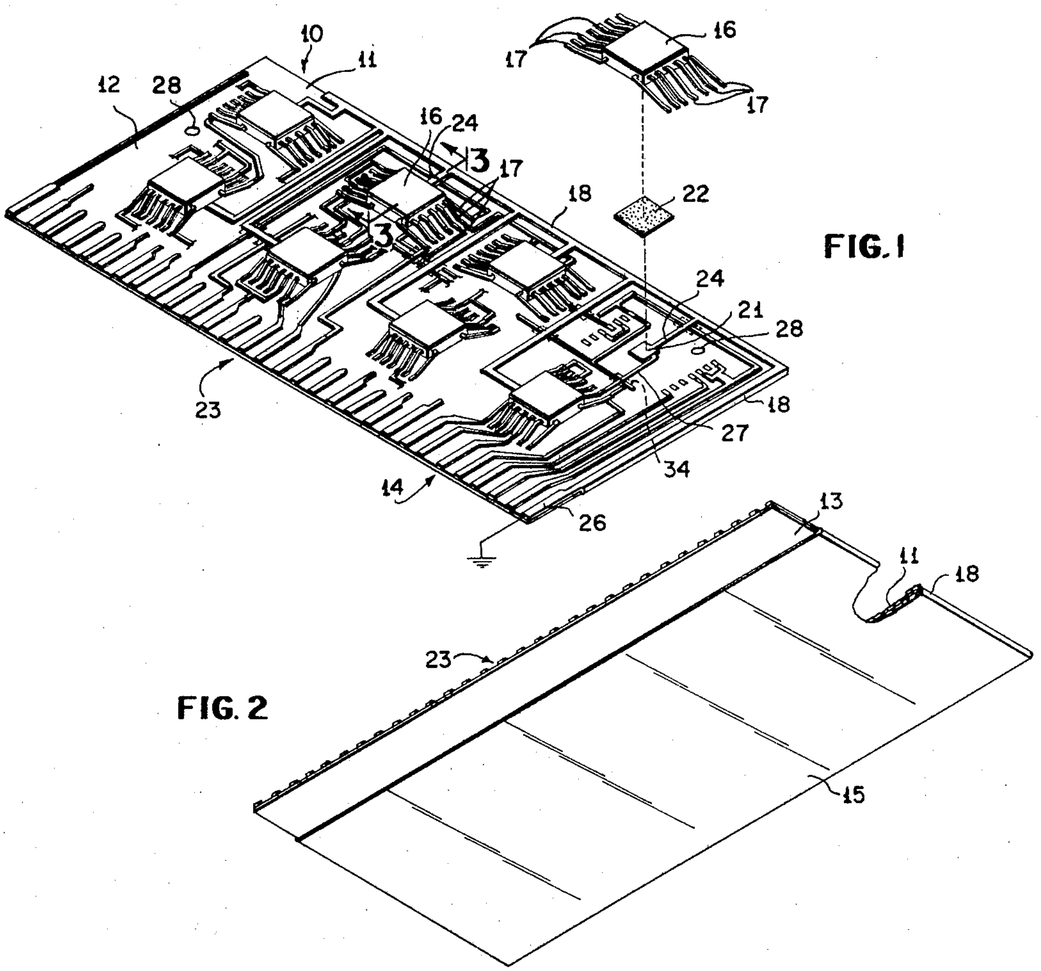

This invention relates to circuit cards and more particularly to ceramic circuit cards adapted for mounting heat emitting circuit modules thereon.

The removal of internally generated heat from circuit modules in the form of integrated circuits, microcircuit packages or flatpacks, is a problem which is further intensified by ever increasing demands for improved higher density packaging of circuit modules. Such thermal problems may be handled in some circuit card constructions by locating the high emitting thermal sources represented by these modules on individual heat sinks and by providing thermal isolation of temperature sensitive components from high emitting sources. However, if it is desired to obtain a high packaging density of these circuit modules, the physical separation of the individual modules on the cards is not an acceptable soluble. One type of miniaturized circuit contained within a circuit module that is presently being used where packaging density is an important factor, such as in data processing systems, is non-saturating emitter coupled integrated circuit logic modules. These modules, when used in high speed electronic computers, must be located close together with interconnections kept as short as possible. The emitter coupled logic modules which are capable of very high speed operation, typically 3 to 5 nanoseconds, continuously dissipate power regardless of their bistable state, as compared to a slower responding saturating logic module which emits power only when it is in one of its bistable states. As a result, the non-saturating emitter coupled logic modules may emit up to twice the amount of heat emitted by a saturating logic module during a comparable period of time under typical operating conditions. The power emitted by the emitter coupled logic modules, if not adequately dissipated, can increase the gain ($\beta$) of the transistors contained within the modules, causing the transistors to operate in their saturable region which decreases the switching response of the logic module, typically from 4 to 10 nanoseconds. It is further necessary to, in some manner, thermally isolate these modules from adjacent high emitting heat sources to maintain the non-saturating operation of the transistors contained within the modules.

Another type of miniaturized circuit contained within a circuit module that is used where heat dissipation is of prime importance is a thin film hybrid microcircuit. Modules of these circuits are especially suited to analog applications where integrated circuitry is not available to perform the function, and reduced size and reliability are important factors such as in computer controlled display equipments. In spite of their small size, thin film hybrid microcircuit modules often dissipate the same amount of heat as their discrete component counterparts. In order to more fully realize the size advantages of the hybrid microcircuits contained in circuit modules, the heat emitted from the circuit modules must be effectively dissipated so that their packaging density may be increased.

In order to overcome the aforementioned thermal disadvantages and to increase the packing density of the circuit modules, the present invention provides a ceramic card with thermally conductive links for drawing the emitted heat from each of the circuit modules to a remotely located heat sink.

More particularly, the circuit card is comprised of an alumina ceramic substrate card on which have been deposited a multilayer pattern of conductors on one side and a conductive plane on a second side with a conductive link about the edge of the card connecting selected conductors, having pads under circuit sites formed by increasing the lateral dimension of portions of the conductors, to the conductive plane which serves as both a heat sink and a grounded shield plane to reduce the noise coupling to the circuit card. Circuit modules are firmly mounted on their respective pads after a thermal conductive compound is applied to the pads to eliminate any air therebetween and to provide increased thermal conduction from the circuit enclosures to the pads. The heat from the pads is then transferred about the edge of the card to the conductive plane on the opposite side by the thermal conductivity of the connecting pattern and further dissipation of the heat is obtained in part by the conductive transfer of heat via the thermally conductive alumina ceramic substrate card towards the conductive plane.

Figure 3:
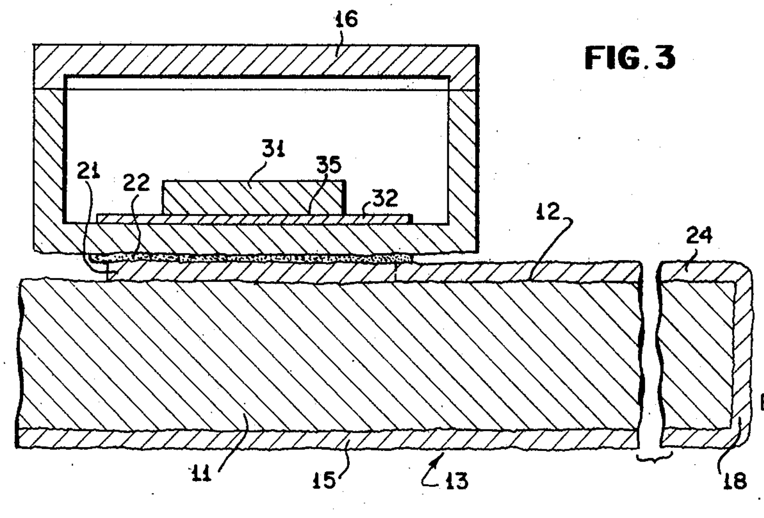

Other objects and features of the invention will become apparent to those skilled in the art as the disclosure is made in the following detailed description of a preferred embodiment of the present invention as illustrated in the accompanying sheet of drawings, in which:

FIG. 1 is a perspective view of the printed circuit board showing the interconnecting circuit conductors and a thermal pad beneath a circuit module in accordance with the invention;

FIG. 2 is a perspective view of the lower surface of the printed circuit board of FIG. 1 partially broken away to show a conductive link about the edge of the board; and FIG. 3 is an enlarged sectional view of a portion of the circuit card shown in FIG. 1, taken along line 3—3 in the direction of the arrows, to show a typical conductive connection from the one side of the circuit card to the other.

Referring to FIGS. 1 and 2, a printed circuit card 10 is shown to include a substrate card 11 that is a rectangular sheet, 1.5 by 3 inches, of insulating material having a thickness of approximately .03 inch and opposed upper and lower surfaces 12 and 13 on which are disposed a multilayer conductive pattern 14 and a conductive plane 15, respectively. A conductive edging 18 on two edges of the circuit card 10 connects the conductive pattern 14 on the upper surface 12 to the conductive plane 15 of the lower surface 13. For purposes of clarity, the conductive pattern 14 is only partially shown in FIG. 1; however, it should be appreciated that the pattern 14 is comprised of a large number of closely spaced conductive paths. The conductive pattern 14 provides connections between leads 17 of circuit modules 16 mounted on the upper surface 12 consistent with their designed signal interchange and further provides connections to a connector edge 23 for transfer of signals from the circuitry included on the circuit card 10 to external circuits. The conductive pattern 14 at the connector edge 23 is shaped so that the circuit card 10 may be inserted into a conventional receptacle (not shown) having spring contacts for each of the edge conductors at the connector edge 23, such a receptacle being well known and commonly referred to as a printed circuit connector. It should be noted that the conductive plane 15 does not extend to the edge 23 and the plane 15 will not be within the printed circuit connector when the edge 23 is inserted therein.

The circuit modules 16 are each attached to the circuit board 10 by fourteen leads 17 which provide electrical connections from the encased circuitry to the conductive pattern 14. The circuit modules 16 are firmly mounted against the circuit card 10 to obtain maximum thermal flow therebetween, by pressing the module against the card 10 with the solder coated leads 17 from the enclosure aligned to the conductor pattern 14 and then welding connections with a current flowing between two adjacent probes placed along a length of each of the leads 17. The heat produced by the current through the leads 17 causes the solder thereon and the solder on the conductive pattern beneath the corresponding length of lead to flow together and form a connection.

Pads 21 are formed in the conductive pattern 14 under the site of the circuit modules 16 by increasing the lateral dimensions of a portion of conductors 24 and circuit modules 16 are firmly mounted on their respective pads 21 after a layer of a thermally conductive compound 22 has been inserted therebetween to eliminate air-pockets and to increase thermal conduction from the circuit modules 16 to the pads 21 which are linked to the conductive edging 18 by conductors 24. The heat from the pads 21 is circulated to the conductive edging 18 and the connecting plane 15 by the routing of conductors 24 from the pads 21 to the edging 18, the crossing of these conductors over other conductors in the conductive pattern 14 being formed by use of multilayers, if necessary.

Multilayer patterns on printed circuit cards may be made by a variety of methods including those techniques commonly referred to as etching or printing; however, in accordance with this invention, it is highly desirable that the pads 21 have a uniform thickness and an extremely flat surface to obtain an efficient transfer of heat from the circuit modules 16. The flat pads 21 of this invention and the precise artwork required by multilayer circuit cards are obtained by a sequential process of successively screen printing materials through a stencil on a substrate card 11 in accordance with the following briefly described process which is known in the art.

Stencils, having the precise dimensional accuracies required for multilayer conductive patterns, are obtained by first drawing an enlarged size of the desired pattern on stable drafting film which is then photo reduced to the proper size and a positive image of the reduced pattern is placed in contact with a stencil film, such as Wetshot 610 made by Ulano Products Company, Inc., and then the film and the positive are exposed to an ultraviolet light. The exposed areas of the stencil film harden and the unexposed areas, remaining relatively soft, are washed out with warm water. The stencil film, mounted on a stainless steel mesh screen supported on a rigid frame, is inserted in a printing machine which permits the loading and the alignment therein of the substrate ceramic card 11 comprised of approximately 96% aluminum oxide ($Al_2O_3$) and commonly referred to as an alumina ceramic. It should be noted that the ceramic material of which the substrate card 11 is comprised is a thermal conductor in addition to being an electrical insulator. A silver palladium ink is drawn across the stencil pattern to flow the ink through the openings of the stencil screen and print the pattern on the substrate card 11, thereby forming the first conductive layer of a multilayer conductive pattern, each conductive layer having an approximate thickness of one mil after firing. The width of the conductive lines is approximately twenty mils and the pads 21 are one hundred mils square with a flatness deviation of approximately .1 mil. It should be noted that the conductive transfer of heat from the circuit enclosure 16 to the pad 21 is enhanced by a small flatness deviation and that the surface dimensions of the pad 21 are smaller than the corresponding dimensions of the circuit modules 16. The pattern is then dried and subsequently cured by firing for approximately 43 minutes in a kiln having an oxidizing atmosphere and reaching a maximum temperature of about 900° C. The silver palladium paint is deposited and fired on other surfaces of the substrate card 11, as desired, prior to the application of materials for subsequent layers on the substrate card 11 which are selected so that for each stage of deposition of the multilayer conductive pattern, the firing temperatures are successively reduced avoiding a second firing of any previously applied layer. Corresponding alignment targets 28 are included on the stencils to provide a rapid registration of the substrate card 11 to the printing stencil for multilayer depositions using different stencils. An insulating layer, e.g., 34, of a dielectric material is printed on the substrate card 11 over portions of the first conductive pattern of silver palladium insulating it from subsequently applied crossing conductors, e.g., 27, and this layer is fired in a kiln. The second conductive layer is then printed on the card through a stencil, using a gold palladium paint which has a lower firing temperature than either of the materials previously applied. After the firing of the second conductive layer, a solder paint is applied through a stencil to the conductive pattern 14 and the solder is then heated causing it to flow into and combined with the covered palladium paints.

The thermal flow from the circuit module 16 to the conductive plane 15 will now be described with reference to FIG. 3 showing a circuit chip 31, the source of the heat in the module 16, typically mounted to the circuit module 16 with a eutectic bonding layer 32. The chip 31, having a mounting surface 35 which may be typically 45 mils square, produces a thermal transfer by both conduction and convection to the surrounding module 16. In addition to the obvious direct convective dissemination of heat from the circuit module 16 to the atmosphere, there is provided a means for disseminating the heat by conduction, i.e., the thermal flow of heat resulting from the contact of the circuit module 16 to the circuit card 10. Specifically, the heat from the circuit module 16 is conducted by direct contact through the conductive compound 22 to the pad 21 and from there to the conductive plane 15 by way of a thermal link formed by conductor 24 and conductive edging 18. The thermal transfer rate of heat away from the circuit module 16 is further improved by the surface area of the thermal link exposed to the atmosphere and to the alumina ceramic substrate card 11, which is an electrical insulator and a thermal conductor, providing additional convective and conductive heat dissemination by the respective exposures. The heat that is conductively transferred to the plane 15 and the ceramic substrate card 11 is easily circulated to the atmosphere from the large surface areas of the plane 15 and the substrate card 11, shown in FIGS. 1 and 2, exposed to the air. It should be appreciated that the described conductive transfer of heat from the pad 21 to the plane 15 and to the substrate card 11 achieves a continuous flow of heat, providing an efficient and effective heat removal from the circuit enclosure 16.

Referring again to FIGS. 1 and 2, a further advantageous result of the use of the conductive plane 15 is obtained by connecting a conductor 26 through a mating printed circuit connector (not shown) to a ground point, grounding the plane 15 to reduce the radiated noise between the printed circuit card 10 and circuitry which is adjacent to the lower surface 13. It is readily seen that where several printed circuit cards 10 are mounted adjacent to one another and with the lower surfaces 13 parallel to and facing the upper surfaces 12, as is commonly done, a ground plane is effectively provided between the circuitry on each of the circuit cards 10 thereby reducing the radiated noise transferred therebetween, for example, by high speed switching signals characteristic of emitter coupled logic circuits. Further benefits obtained by connecting lead 26 to a ground point, is that the arrangement of the conductive pattern 14 is simplified by using the pads 21 as a junction for making ground connections to the circuit modules 16, e.g., conductor 27, and the capacitive effect of the dielectric properties of the ceramic substrate card 11 produces a matched characteristic impedance of the conductors on the upper surface 12 to the ground plane 15 on the lower surface 13.

From the above description, it will be apparent that there is thus provided a device of the character described possessing the particular features of advantage before enumerated as desirable, but which obviously is susceptible of modification in its form, proportions, detail construction and arrangement of parts without departing from the principle involved or sacrificing any of its advantages. It is to be understood that the invention is not limited to the specific features shown, but that the means and construction herein disclosed comprise the preferred form of several modes of putting the invention into effect, and the invention is, therefore, claimed in any of its forms or modifications within the legitimate and valid scope of the appended claims.

What is claimed is:

1. A circuit card for providing a high density circuit pattern having a plurality of thermal emitting circuit modules mounted thereon, comprising a ceramic substrate having two opposing surfaces, a conductive circuit pattern comprised of a plurality of conductive paths disposed on one of said surfaces of said substrate with selected ones of the conductive paths having circuit pads formed therealong, a circuit module mounted on said circuit pads, a plane of conductive material substantially covering the second opposing surface of the substrate, and a strip of conductive material provided along an edge of the substrate for connecting the conductive paths provided with circuit pads on one surface to said conductive plane on the second opposing surface.

2. The invention in accordance with claim 1 wherein a layer of thermal compound is deposited between the circuit pads and the circuit modules mounted thereon for ensuring an intimate contact therebetween and for increasing the thermal conductivity from the circuit module to the pad.

3. The invention in accordance with claim 1 wherein the substrate is comprised of a ceramic material having an aluminum oxide content of about 96%.

4. The invention in accordance with claim 1 wherein one side of the substrate is provided with conductive edge connections for connection with external circuitry, and connections from said conductive edge connections to the pads and the plane are provided by the conductive pattern disposed on the substrate.

5. The invention in accordance with claim 4 wherein the said second opposing surface of the substrate is free of the conductive plane in an area corresponding to the conductive edge connections on the other one of said surfaces.

6. A circuit card designed to provide a plurality of thermal emitting circuit modules mounted on a high density circuit pattern, comprising a ceramic substrate card having two opposing surfaces, a circuit pattern comprised of a plurality of conductive paths on one of said surfaces for providing connections between circuit modules and with selected conductors crossing an orderly array of circuit module mounting sites, circuit pads formed at the mounting sites by increasing the lateral dimension of portions of said selected conductors, a circuit module positioned on each of said pads, a layer of thermally conductive compound for ensuring a close contact of the surface of the circuit module to the surface of the pad, and thermally conductive paths formed from the circuit pattern and extending on said surface in a direction away from the circuit pads.

7. The invention in accordance with claim 6 wherein a plane of conductive material is deposited on the second of said opposing surfaces, a strip of conductive material is provided along a portion of an edge of the substrate card, and said thermally conductive paths connect the pads via said edge strip of conductive material to said plane of conductive material whereby heat generated by the circuit modules is continuously transferred to the plane on the opposing surface.

References Cited

UNITED STATES PATENTS

| | | | |
|---|---|---|---|
| 3,061,760 | 10/1962 | Ezzo | 317—100 |
| 3,141,998 | 7/1964 | Silkman | 317—100 |
| 3,165,672 | 1/1965 | Gellert | 317—100 |
| 3,187,226 | 6/1965 | Kates | 317—100 |
| 3,211,822 | 10/1965 | Krall et al. | 317—100 |

ROBERT K. SCHAEFER, Primary Examiner

D. SMITH, Jr., Assistant Examiner

U.S. Cl. X.R.

74—68.5; 317—101